(12) United States Patent
Wu et al.

(10) Patent No.: US 6,843,833 B2
(45) Date of Patent: Jan. 18, 2005

(54) FRONT OPENING UNIFIED POD AND ASSOCIATED METHOD FOR PREVENTING OUTGASSING POLLUTION

(75) Inventors: Jung-Yuan Wu, Hsinchu (TW); Kuo-Hwa Huang, Hsinchu (TW)

(73) Assignee: Powerchip Semiconductor Corp., Hsinchu (TW)

( * ) Notice: Subject to any disclaimer, the term of this patent is extended or adjusted under 35 U.S.C. 154(b) by 0 days.

(21) Appl. No.: 10/250,229

(22) Filed: Jun. 16, 2003

(65) Prior Publication Data

US 2004/0250519 A1 Dec. 16, 2004

(51) Int. Cl.[7] .............................. B01D 46/00; B08B 3/02; B08B 5/04
(52) U.S. Cl. .................. 95/273; 15/312.1; 15/316.1; 15/347; 15/415.1; 55/385.2; 55/467
(58) Field of Search .................. 15/300.1, 312.1, 15/312.2, 316.1, 347, 405, 415.1; 55/385.1, 385.2, 385.7, 467; 95/273, 286, 291

(56) References Cited

U.S. PATENT DOCUMENTS

| | | | | |
|---|---|---|---|---|
| 4,668,484 A | * | 5/1987 | Elliott | 422/113 |
| 4,677,704 A | * | 7/1987 | Huggins | 15/1.51 |
| 5,122,170 A | * | 6/1992 | Satoh et al. | 96/134 |
| 5,238,503 A | * | 8/1993 | Phenix et al. | 134/37 |
| 5,661,872 A | * | 9/1997 | Meyer et al. | 15/309.2 |
| 5,932,013 A | * | 8/1999 | Salli et al. | 118/715 |
| 6,192,547 B1 | * | 2/2001 | Song | 15/308 |
| 6,284,020 B1 | * | 9/2001 | Mizuno et al. | 95/26 |
| 6,289,550 B1 | * | 9/2001 | Chen et al. | 15/303 |
| 6,395,064 B1 | * | 5/2002 | Xu et al. | 95/15 |
| 6,494,965 B1 | * | 12/2002 | Walker et al. | 134/21 |
| 6,643,893 B2 | * | 11/2003 | Momonoi et al. | 15/303 |
| 6,676,770 B2 | * | 1/2004 | Hou et al. | 134/34 |
| 2002/0104555 A1 | * | 8/2002 | Sugano | 134/30 |
| 2002/0194995 A1 | * | 12/2002 | Shiramizu | 95/273 |
| 2003/0079448 A1 | * | 5/2003 | How et al. | 55/385.2 |
| 2003/0150329 A1 | * | 8/2003 | Kamono | 95/291 |
| 2003/0235635 A1 | * | 12/2003 | Fong et al. | 425/73 |

* cited by examiner

Primary Examiner—Robert H. Spitzer
(74) Attorney, Agent, or Firm—Jiang Chyun IP Offices

(57) ABSTRACT

A front opening unified pod for preventing the contamination of wafers due to outgassing. The front opening unified pod includes a front opening unified pod body and a cleaning apparatus. The front opening unified pod has an opening section and a base plate within the opening section and the base plate facing each other. The cleaning apparatus has at least an air-blasting element installed inside the front opening of the unified pod body. An air supplying system connected to the air-blasting element provides a stream of air.

14 Claims, 3 Drawing Sheets

FRONT OPENING UNIFIED POD AND ASSOCIATED METHOD FOR PREVENTING OUTGASSING POLLUTION

BACKGROUND OF INVENTION

1. Field of Invention

The present invention relates to a semiconductor fabrication process and equipment. More particularly, the present invention relates to a front opening unified pod and associated method for preventing outgassing pollution.

2. Description of Related Art

Following the rapid increase in the level of integration for semiconductor devices, accuracy in dimension as well as material composition in each fabricating step has become increasingly important. Any minor error or pollution may lead to serious production loss or scrapping of a large quantity of wafers.

In semiconductor production, the processing station used for fabricating semiconductor devices typically includes a plurality of modules (for example, processing transport storage/safety link/gaseous reactant). In addition, the processing station may include a wafer transfer system for transporting wafers between various processing modules and the storage modules. In general, wafers are retrieved from a wafer carrier using a specially designed robotic blade and transferred to a processing chamber for a reaction. After the reaction, the wafer is transferred from the reaction chamber back to the wafer carrier so that a subsequent processing step can be initiated.

A conventional 8-inch wafer uses a type of wafer carrier called a standard mechanical interface (SMIF). However, as manufacturing technology continues to improve, the size of wafer that can be processed has increased to 12 inches. To accommodate larger wafers such as the 12-inch wafers, a specially designed wafer carrier called the front opening unified pod (FOUP) has been developed. The FOUP has an air-sealed chamber for holding wafers so that dust particles suspended in the air are prevented from polluting the wafers. When wafers need to be loaded into a piece of processing equipment, the door of the FOUP is opened so that a robotic blade is permitted to pick up a wafer inside the sealed chamber.

FIG. 1 is a top view of a conventional wafer-processing semiconductor fabrication station. As shown in FIG. 1, the processing station 100 includes a reaction chamber 102, a load-locking area 104, a mini-environment area 106, a couple of robotic blades 108, 110 and a front opening unified pod base 112.

Before carrying out a reaction process, the front opening unified pod 114 needs to be secured tightly to the front opening unified pod base 112. To transfer wafers into the reaction chamber 102, the robotic blade 108 inside the mini-environment area 106 is used to pick up a wafer inside the front opening unified pod 114 and then the wafer is downloaded onto a wafer boat 116 inside the load-locking area 104. Thereafter, the robotic blade 110 is used to transport the wafer boat 116 into the reaction chamber 102. After the processing reaction, the robotic blade 110 is again used to move the wafer boat 116 out and then the robotic blade 106 is again used to transfer the wafer inside the wafer boat 116 into the front opening unified pod 114. The aforementioned steps are repeated until all the wafers inside the front opening unified pod 114 have been processed.

In the aforementioned process, a single wafer is reacted each time. However, most front opening unified pods are capable of holding a few tens of wafers. Hence, it takes some time to process the whole batch of wafers inside the front opening unified pod. If the processed wafers inside the front opening unified pod generate some outgassing, the gas (for example, phosphene) that diffuses out of the wafer may fill up the entire space within front opening unified pod leading to some contamination of the untreated wafers. Through such contamination, yield of the processing reaction will drop.

SUMMARY OF INVENTION

Accordingly, one object of the present invention is to provide a front opening unified pod and associated method for preventing wafer pollution due to outgassing so that the product yield is increased.

To achieve these and other advantages and in accordance with the purpose of the invention, as embodied and broadly described herein, the invention provides a front opening unified pod capable of preventing outgassing pollution. The front opening unified pod includes at least a front opening unified pod body and a cleaning apparatus. The front opening unified pod body has an opening section and a base plate. The base plate and the opening section face each other. The cleaning apparatus includes at least an air-blasting element set up inside the front opening unified pod body and an air supplying system connected to the air-blasting element to provide a continuous stream of air on demand.

The air-blasting element is set up on the base plate. The air-blasting element can be an air filter or a nozzle. The air-blasting element may blow out inert gas or nitrogen.

In this invention, a cleaning apparatus is installed on the sidewall of the base plate inside the front opening unified pod facing the opening section. The air ejected from the cleaning apparatus carries any gases diffused from the wafer away from the front opening wafer pod and hence prevents the pollution of unprocessed wafers. Furthermore, the front opening unified pod has a very simple design and hence requires no major alteration of the processing station and incurs no major cost. In addition, the front opening unified pod of this invention can be mounted or dissembled with ease so that its application is convenient. Moreover, the air-blasting element has a filtering action for maintaining the interior of the front opening unified pod at a definite level of cleanliness.

This invention also provides a method of preventing wafer pollution due to the outgassing of processed wafer inside a front opening unified pod. First, a plurality of wafers is loaded into a front opening unified pod having a cleaning apparatus capable of producing a stream of air therein. Thereafter, an unprocessed wafer is transferred to a reaction chamber and then the wafer is processed. After that, the processed wafer is returned to the front opening unified pod. The aforementioned steps are repeated until all the wafers inside the front opening unified pod are processed. All through the processing operations, the cleaning apparatus keeps blowing a jet of air out so that the air inside the front opening wafer pod is constantly flushed out and thus preventing the unprocessed wafer from being contaminated.

The cleaning apparatus includes at least an air-blasting element set up inside the front opening unified pd pod body and an air supplying system connected to the air-blasting element to provide a continuous stream of air on demand. The air-blasting element is set up on a base plate inside the front opening unified pod. The air-blasting element can be an air filter or a nozzle. The air-blasting element may blow out inert gas or nitrogen.

In this invention, the cleaning apparatus is used to carry the gases diffused from the processed wafer away from the front opening unified pod throughout the processing period. Hence, the unprocessed wafers inside the front opening unified pod are prevented from any contamination. Furthermore, the front opening unified pod has a very simple design and hence requires no major alteration of the processing station and incurs no major cost. In addition, the front opening unified pod of this invention can be mounted or dissembled with ease so that its application is convenient. Moreover, the air-blasting element has a filtering action for maintaining the interior of the front opening unified pod at a definite level of cleanliness.

It is to be understood that both the foregoing general description and the following detailed description are exemplary, and are intended to provide further explanation of the invention as claimed.

BRIEF DESCRIPTION OF DRAWINGS

The accompanying drawings are included to provide a further understanding of the invention, and are incorporated in and constitute a part of this specification. The drawings illustrate embodiments of the invention and, together with the description, serve to explain the principles of the invention.

DETAILED DESCRIPTION

Figure 1:
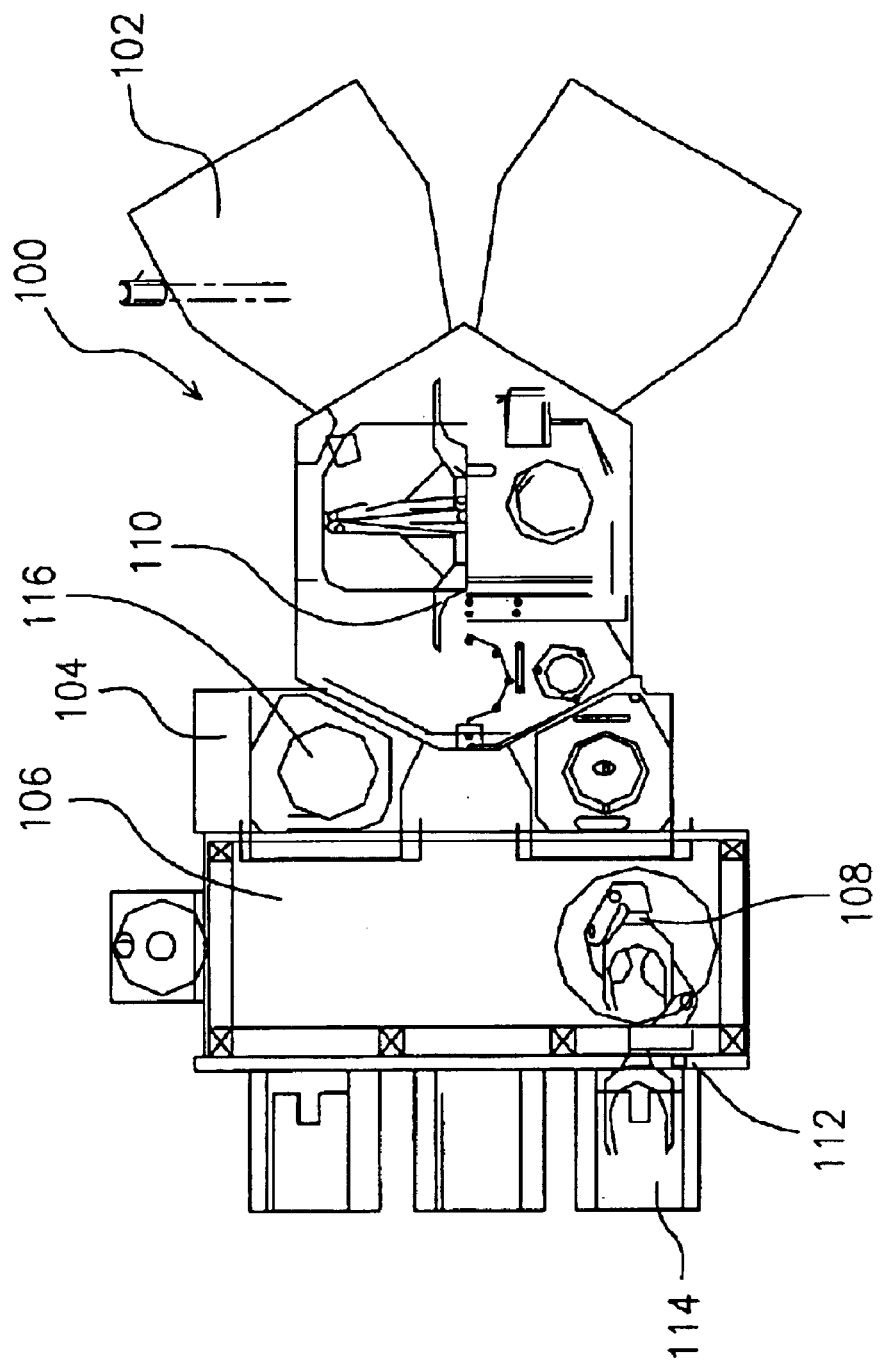
FIG. 1 is a top view of a conventional wafer-processing semiconductor fabrication station.

Reference will now be made in detail to the present preferred embodiments of the invention, examples of which are illustrated in the accompanying drawings. Wherever possible, the same reference numbers are used in the drawings and the description to refer to the same or like parts.

Figure 2:
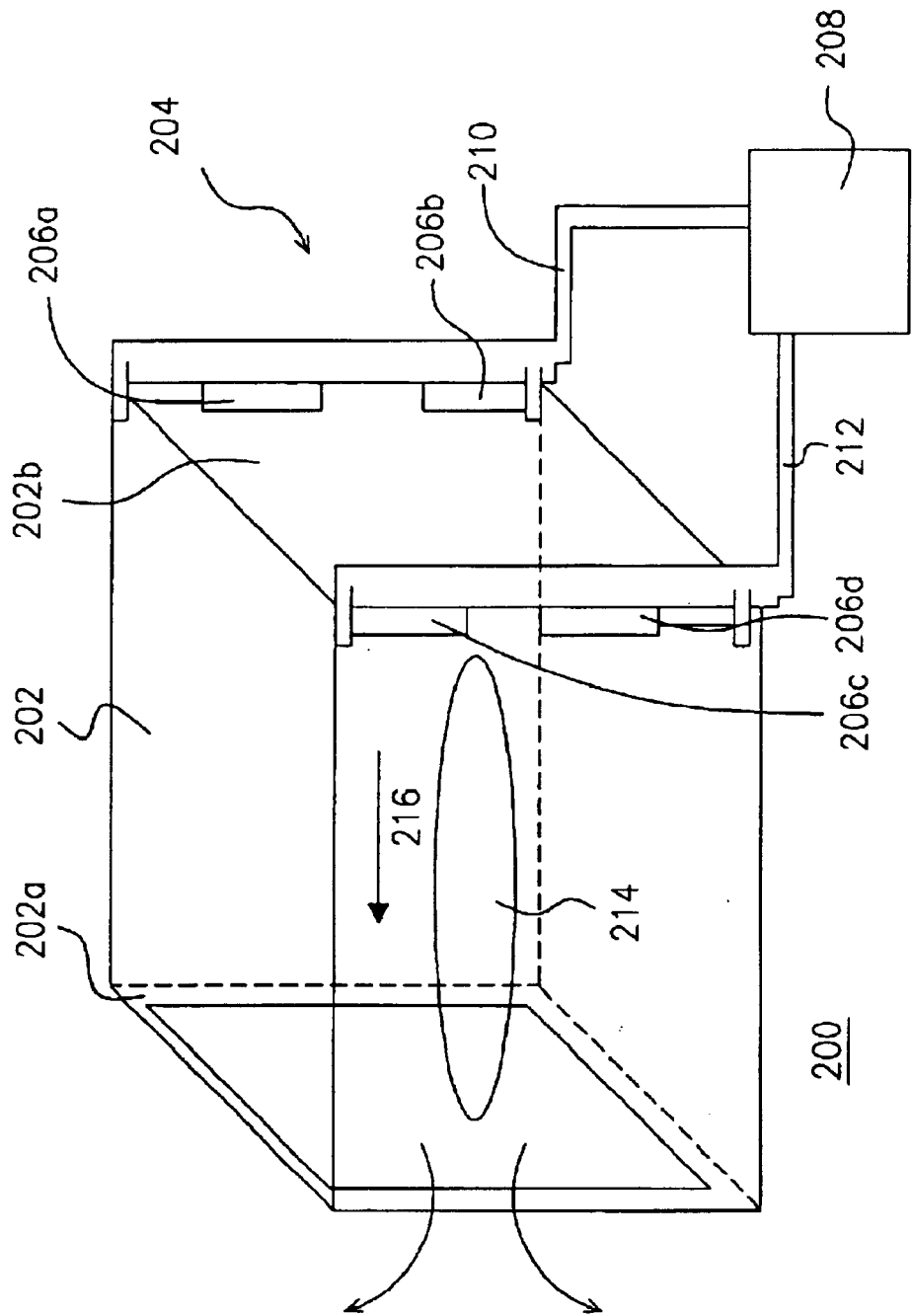
FIG. 2 is a schematic three-dimensional view of the structure of a front opening unified pod according to this invention.

FIG. 2 is a schematic three-dimensional view of the structure of a front opening unified pod according to this invention. As shown in FIG. 2, the front opening unified pod 200 includes a front opening wafer pod body 202 and a cleaning apparatus 204. The cleaning apparatus 204 includes, for example, a plurality of air-blasting elements 206a to 206d, an air supplying system 208 and a set of pipelines 210 and 212.

The air-blasting elements 206a to 206d are set up inside the front opening unified pod 202 such that the air-blasting elements 206a and 206b are spread out alternately along the left and right side of a base plate 202b facing the opening 202a. For example, the air-blasting elements 206a and 206b are set up on one side of the base plate 202b with a distance between the two. Similarly, the air-blasting elements 206c and 206d are set up on the other side of the base plate 202b with a distance between the two. However, the pair of air-blasting elements 206a, 206b alternates in height level with the pair of air-blasting elements 206c, 206d. The air-blasting elements 206a to 206d are, for example, air nozzles or air filters fabricated using resinous or ceramic material. The air blowing out of the air-blasting elements 206a to 206d preferably produces a laminar flow 216 so that the gases diffusing from processed wafers 214 are blown away smoothly. In addition, the air blown out from the air-blasting elements 206a to 206d also purges any impurities suspended in the air inside the front opening unified pod 200. The air from the air-blasting elements 206a to 206d is provided by an air supplying system 208 such as a clean compressed air tank or an inert gas tank (that holds nitrogen, helium, neon, argon, krypton or xenon). The pipelines 210 and 212 connect the air-blasting elements 206a to 206d to the air supplying system 208. The pipeline 210 connects the two air-blasting elements 206a and 206b while the pipeline 212 connects the two air-blasting elements 206c and 206d.

To operate the front opening unified pod 200, the air supplying system 208 is turned on to provide a constant flow of air (for example, gaseous nitrogen) into various air-blasting elements 206a to 206d through the pipelines 210 and 212. The air flowing out of the air-blasting elements 206a to 206d is filtered before going into the front opening wafer pod 200. Furthermore, the air from the air-blasting elements 206a to 206d creates a laminar flow inside the front opening unified pod 200 so that any diffused gases from the processed wafer are flushed out. In other words, a high degree of cleanliness is maintained inside the front opening wafer pod 200.

In the aforementioned embodiment of this invention, a total of four air-blasting elements are used. However, the actual number of air-blasting elements should depend on the actual design. In addition, the air-blasting elements are set up on the left and right side of the base plate facing the opening of the front opening unified pod body. Obviously, the air-blasting elements can also be set up on the top and the bottom side of the base plate or some other positions. Furthermore, the air-blasting elements can even be installed all over the base plate.

Figure 3:
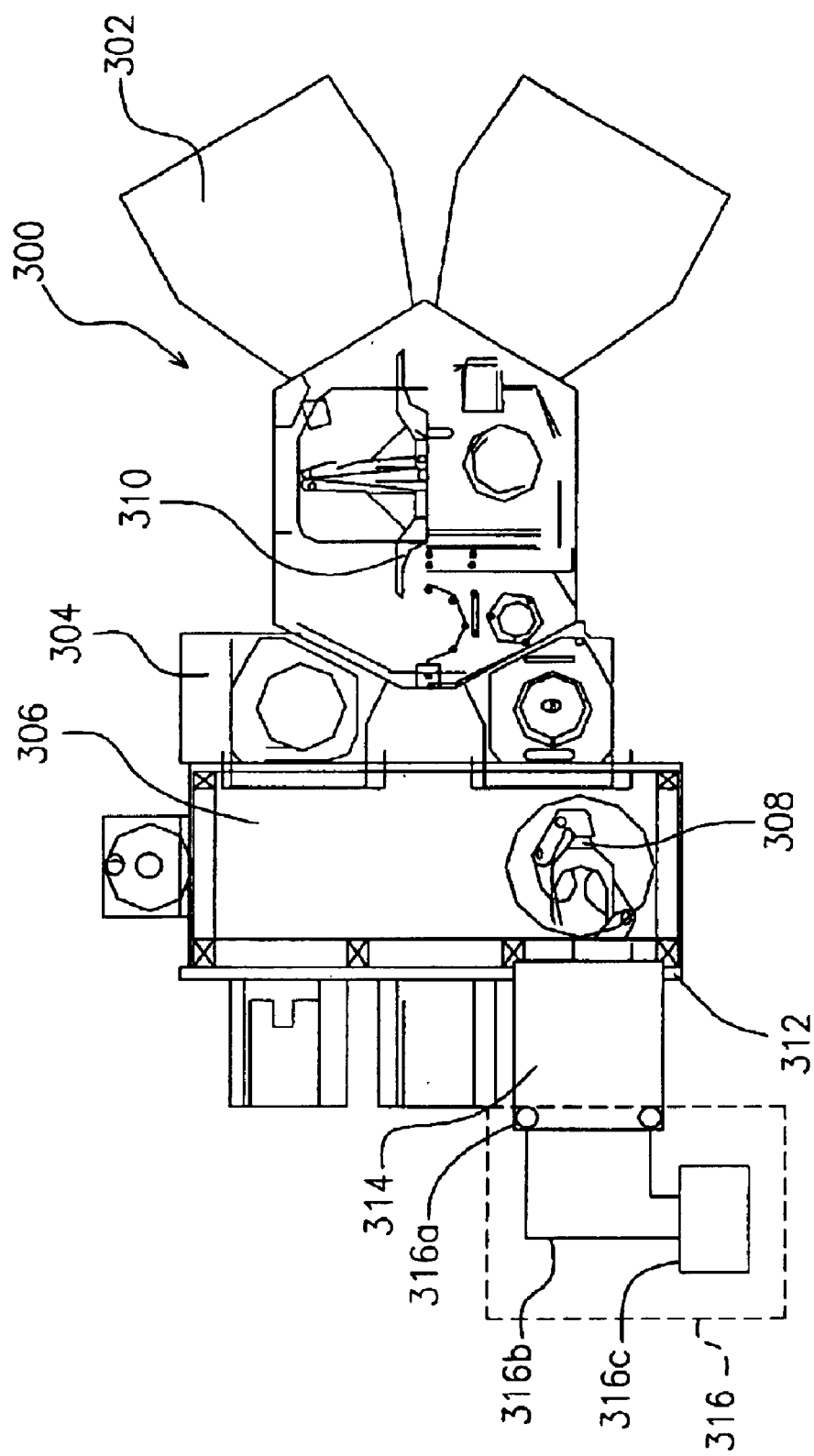
FIG. 3 is a top view showing a wafer-processing semiconductor fabrication station that incorporates a front opening unified pod according to this invention.

FIG. 3 is a top view showing a wafer-processing semiconductor fabrication station that incorporates a front opening unified pod according to this invention. As shown in FIG. 3, the processing station 300 includes a reaction chamber 302, a load-locking area 304, a mini-environment area 306, a couple of robotic blades 308, 310, a front opening unified pod base 312 and a front opening unified pod 314. The front opening unified pod 314 is set up on the front opening unified pod base 312 and a cleaning apparatus 316 is installed inside the front opening unified pod 314.

To transfer wafers into the reaction chamber 302, the robotic blade 308 inside the mini-environment area 306 is used to pick up a wafer inside the front opening unified pod 314 and then the wafer is downloaded onto a wafer boat inside the load-locking area 304. Thereafter, the robotic blade 310 is used to transport the wafer boat into the reaction chamber 302.

After the processing reaction, the robotic blade 310 is again used to move the wafer boat out of the reaction chamber 302 and then the robotic blade 308 is again used to transfer the wafer from the mini-environment area 306 into the front opening unified pod 314. The aforementioned steps are repeated to bring all the unprocessed wafers to the reaction chamber 302 and return all processed wafers back to the front opening unified pod 314. Throughout the period from the transport of the first unprocessed wafer to the reaction chamber 302 to the return of the last processed wafer to the front opening unified pod 314, the cleaning apparatus 316 is turned on. Thus, air from the air supplying system 316c carried by the pipeline 316b is blown into the front opening unified pod 314 via the air-blasting elements 316a. When outgassing does occur in the processed wafers, the diffused gas (for example, phosphene) from the wafers is blown out of the front opening unified pod 314 by the air from the air-blasting elements 316a. Therefore, the unprocessed wafers inside the front opening unified pod 314 are prevented from contamination leading to a drop in product yield.

In this invention, a cleaning apparatus is installed to carry any gases diffused from the processed wafer away from the front opening unified pod throughout the processing period. Hence, the unprocessed wafers inside the front opening unified pod are prevented from any contamination.

Furthermore, the front opening unified pod has a very simple design and hence requires no major alteration of the processing station and incurs no major cost.

In addition, the front opening unified pod of this invention can be mounted or dissembled with ease so that its application is convenient. Moreover, the air-blasting element has a filtering action for maintaining the interior of the front opening unified pod at a definite level of cleanliness. It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method for preventing outgassing pollution, comprising the steps of:
   (a) loading a plurality of wafers into a front opening unified pod, wherein the interior of the front opening unified pod has at least a cleaning apparatus which is capable of producing a jet of air directed towards an opening of the front opening unified pod;
   (b) transferring an unprocessed wafer from the front opening unified pod to a reaction chamber through the opening of the front opening unified pod;
   (c) processing the unprocessed wafer inside the reaction chamber to produce a processed wafer;
   (d) transferring the processed wafer from the reaction chamber to the front opening unified pod;
   (e) repeating the steps from (b) to (d) until all the wafers inside the front opening unified pod are processed; and
   (f) blowing the jet of air via the cleaning apparatus into the front opening unified pod throughout the period when the steps from (b) to (e) are performed so that the front opening unified pod is purged to remove any possible contaminants that might contaminate the unprocessed wafers.

2. The method of claim 1, wherein the cleaning apparatus comprises:
   at least an air-blasting element set up inside the front opening unified pod; and
   an air supplying system connected to the air-blasting element for providing a stream of air to the air-blasting element.

3. The method of claim 2, wherein the air-blasting element is set up on sidewall of a base plate positioned opposite to the opening of the front opening unified pod.

4. The method of claim 2, wherein the air-blasting element comprises a filter.

5. The method of claim 2, wherein the air-blasting element comprises a nozzle.

6. The method of claim 1, wherein the jet of air comprises an inert gas.

7. The method of claim 1, wherein the jet of air comprises gaseous nitrogen.

8. The method of claim 1, wherein in step (f), the jet of air is a laminar flow.

9. A front opening unified pod for preventing outgassing pollution, comprising at least:
   a front opening unified pod body having a first opening section and a base plate, wherein the base plate and the opening section face each other; and
   a cleaning apparatus, comprising:
       at least an air-blasting element set up on the base plate facing the first opening section of the front opening unified pod body; and
       an air supplying system connected to the air-blasting element for providing a stream of air to the air-blasting element.

10. The front opening unified pod of claim 9, wherein the air-blasting element is set up on sidewall of the base plate.

11. The front opening unified pod of claim 9, wherein the air-blasting element comprises a filter.

12. The front opening unified pod of claim 9, wherein the air-blasting element comprises a nozzle.

13. The front opening unified pod of claim 9, wherein the stream of air comprises an inert gas.

14. The front opening unified pod of claim 9, wherein the stream of air comprises gaseous nitrogen.

* * * * *